United States Patent [19]
Horie

[11] Patent Number: 5,430,749
[45] Date of Patent: Jul. 4, 1995

[54] LASER DIODE DRIVING CIRCUIT

[75] Inventor: Hiromitsu Horie, Kawasaki, Japan

[73] Assignee: Fujitsu Limited, Kawasaki, Japan

[21] Appl. No.: 306,326

[22] Filed: Sep. 15, 1994

[30] Foreign Application Priority Data

Dec. 1, 1993 [JP] Japan .................. 5-301645

[51] Int. Cl.$^6$ .............................................. H01S 3/00
[52] U.S. Cl. ..................................................... 372/38
[58] Field of Search ....................... 372/38, 25, 29, 30, 372/33

[56] References Cited

U.S. PATENT DOCUMENTS 3,925,735 12/1975 Ozeki et al. ............................ 372/38
4,807,239 2/1989 Takano et al. ......................... 372/38
5,349,595 9/1994 Ogawa et al. ......................... 372/38

FOREIGN PATENT DOCUMENTS 4-94581  3/1992  Japan .

Primary Examiner—Rodney B. Bovernick
Assistant Examiner—Robert E. Wise
Attorney, Agent, or Firm—Staas & Halsey

[57] ABSTRACT

An inverter inverts the polarity of a laser diode driving signal LDS, and a delay circuit delays the laser diode driving signal LDS by the time required for the polarity inversion by the delay circuit. Conduction of first and second switching elements are differentially controlled in accordance with the inversion signal *LDS and a delay signal LDD. When the first switching element is on and the second switching element is off, a driving current Id is supplied to a laser diode so as to emit light. On the other hand, when the first switching element is off and the second switching element is on, a current is supplied to an impedance element, while the driving current Id becomes zero, and the light is extinct. Thus, it is possible to adjust the time for rise and the time for fall of the inversion signal *LDS to be respectively equal to the time for fall and the time for rise of the delay signal LDD, to prevent overshoot of the driving current Id and, hence, overshoot of a light emission power, and to adjust the light emission time of the laser diode to the preset time.

5 Claims, 10 Drawing Sheets

LASER DIODE DRIVING CIRCUIT

BACKGROUND OF THE INVENTION

1. Field of the Invention

The present invention relates to a laser diode driving circuit and, more particularly, to a laser diode driving circuit which prevents the overshoot of a light emission power and which can adjust the light emission time to be equal to the preset time.

2. Description of the Related Art

A laser diode is utilized as a light source for image formation in an electrophotographic printer, a light source of an optical transmitter in optical communication, and in other various fields.

FIG. 9 shows the structure of a laser diode driving circuit. The reference numeral 3a represents a laser diode, 11 an inverter for inverting the polarity of a laser diode light emission signal (laser diode driving signal) LDS, 12 a first NPN switching transistor which is turned on/off in accordance with an inversion signal *LDS, 13 a second switching transistor which is differentially turned on/off with respect to the first switching transistor 12 in accordance with the laser diode light emission signal LDS, 14 an impedance element provided with an impedance characteristic which is approximately equivalent to that of the laser diode 3a, 15 a constant-current source for supplying a current to the laser diode 3a and the impedance element 14, and 16, 17 resistors. The laser diode 3a is disposed between the collector of the first switching transistor 12 and the constant-current source 15, and the impedance element 14 is disposed between the collector of the second switching transistor 13 and the constant-current source 15.

The laser diode driving circuit has the above-described differential structure, and it is so controlled that the sum of the currents Id and Ii flowing to the transistors 12 and 13, respectively, is constant. When the level of the laser diode light emission signal LDS is lowered so as to emit light from the laser diode 3a, the first switching transistor 12 is energized, while the second switching transistor 13 is turned off. As a result, the driving current Id flows to the laser diode 3a, while the current Ii becomes zero, and the laser diode 3a emits light. On the other hand, when the level of the laser diode light emission signal LDS is raised so that the light of the laser diode 3a is extinct, the first switching transistor 12 is turned off, while the second switching transistor 13 is energized. As a result, the current Ii flows to the impedance element 14, while the driving current Id becomes zero, and the light is extinct. In this case, the aptitude to overshoot at the rise of the driving current Id is cancelled by the aptitude to undershoot of the impedance element 14, so that a driving current wave form having little overshoot is obtained.

In this way, the differential structure can reduce the overshoot and the undershoot of the driving current which are caused in a laser diode driving circuit having no differential structure, and can produce a comparatively stable amount of light emission.

In a conventional laser diode driving circuit, the inverter 11 inverts the laser diode light emission signal LDS, and the switching transistors 12, 13 are differentially turned on/off in accordance with the complementary signals LDS, *LDS.

However, since the inversion of the polarity takes time, there is a delay in the inversion signal *LDS, which delay produces a lag of current switching, i.e., a lag of switching timing between the first and the second transistors. Due to the lag of timing, the differential function does not work sufficiently, and overshoot is produced in the driving current Id and, hence, in the light emission power. That is, in a conventional laser diode driving circuit, reduction in overshoot and undershoot is not satisfactory.

In addition, in a conventional laser diode driving circuit, the light emission time becomes shorter than the preset time due to the lag of switching timing, so that it is impossible to obtain the desired light emission power in total.

FIG. 10 shows the signal wave form of each part of the laser diode driving circuit so as to explain the shortened light emission time.

The inversion signal *LDS (b) rises or falls a predetermined time td behind the time for falling and the time for rising of the laser diode light emission signal LDS (a).

When only the first switching transistor 12 is conductive, the driving current Id which is necessary for light emission flows to the laser diode 3a. Therefore, the laser diode 3a starts light emission by the rise of the inversion signal *LDS and the light is extinct at the rise of the laser diode light emission signal LDS. As a result, the laser diode light emission time (c) is (T−td), which is shorter by td than the preset time T.

SUMMARY OF THE INVENTION

Accordingly, it is a first object of the present invention to eliminate the above-described problems in the related art and to provide a laser diode driving circuit in which the timing of switching on/off of the first switching element is the same with the second switching element.

It is a second object of the present invention to provide a laser diode driving circuit which can prevent overshoot of a light emission power and which can adjust the light emission time to be equal to the preset time.

To achieve these ends, the present invention provides a laser diode driving circuit comprising a delay circuit for delaying a laser diode driving signal so as to adjust the time for rise and the time for fall of an inversion signal to be equal to the time for fall and the time for rise of a delay signal and for differentially turning on/off the first switching signal and the second switching signal in accordance with the inversion signal and the delay signal.

Other features and advantages of the present invention will be apparent from the following description taken in conjunction with the accompanying drawings.

DESCRIPTION OF THE PREFERRED EMBODIMENTS

(a) Schematic Structure of the Present Invention

Figure 1:
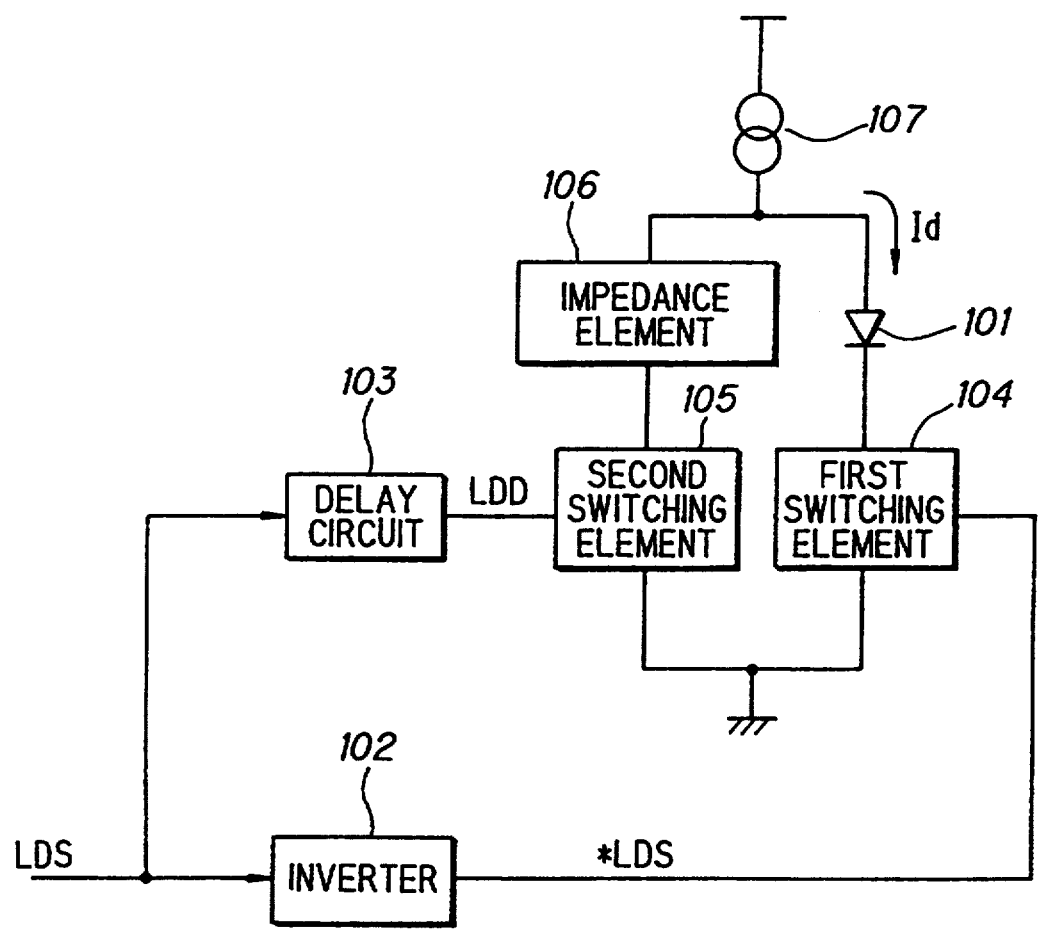
FIG. 1 schematically explains the principle of the present invention.

FIG. 1 schematically explains the principle of the present invention.

The reference numeral 101 represents a laser diode, 102 an inverter for inverting the polarity of a laser diode driving signal, 103 a delay circuit for delaying a laser light emission signal (laser diode driving signal) LDS, 104 a first switching element which is connected to the laser diode 101 and the conduction of which is controlled in accordance with the inversion signal *LDS, 105 a second switching element the conduction of which is differentially controlled with respect to the first switching element 104 in accordance with a delay signal LDD, 106 an impedance element which is connected to the second switching element 105, and 107 a constant-current source for supplying a current to the laser diode 101 and the impedance element 106.

The inverter 102 inverts the polarity of the laser diode driving signal LDS, and the delay circuit 103 delays the laser diode driving signal LDS by the time which is required for the polarity inversion. In accordance with the inversion signal *LDS and the delay signal LDD, the conduction of the first and the second switching elements 104, 105 are differentially controlled. When the first switching element 104 is on and the second switching element 105 is off, the driving current Id is supplied to the laser diode 101 so as to emit light. On the other hand, when the first switching element 104 is off and the second switching element 105 is on, the current is supplied to the impedance element 106 so that the driving current Id becomes zero and the light of the laser diode 101 is extinct. In this way, by providing the delay circuit 103 so as to adjust the time for rise and the time for fall of the delay signal LDD to be equal to the time for fall and the time for rise of the inversion signal *LDS and differentially turning on/off the first switching element 104 and the second switching element 105 in accordance with the inversion signal *LDS and the delay signal LDD, it is possible to prevent overshoot of the driving current Id and, hence, overshoot of a light emission power, and to adjust the light emission time of the laser diode 101 to the preset time.

The delay circuit 103 is composed of, for example, a plurality of delay elements for setting various delay times, and a selector for selecting the output of the delay element whose delay time is equal to the inversion time as the delay signal LDD. In this case, an inversion time measuring portion for measuring the inversion time of the inverter 102 is provided, and the selector selects the output of a predetermined delay element on the basis of the inversion time and outputs it as the delay signal LDD. In this way, the time for rise and the time for fall of the inversion signal *LDS is automatically adjusted to the time for fall and the time for rise of the delay signal LDD.

(b) First Embodiment

Figure 2:
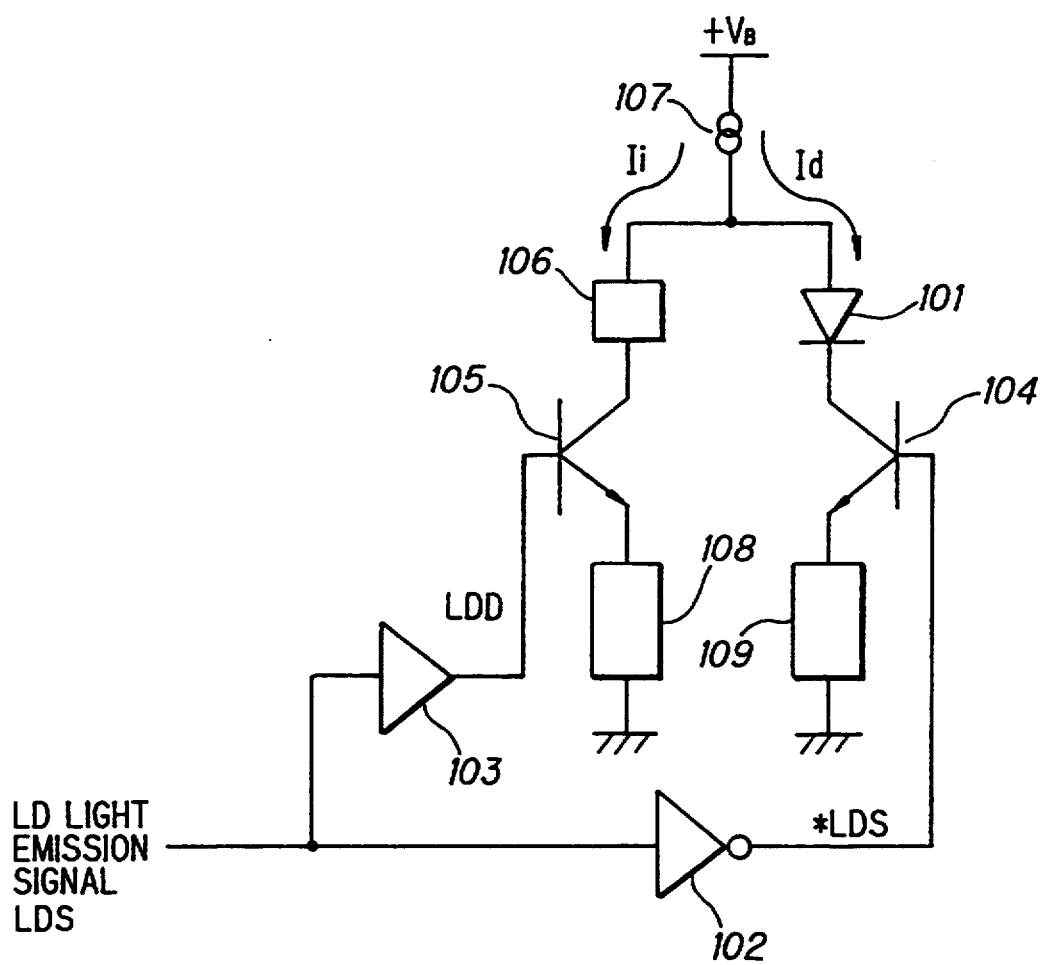
FIG. 2 shows the structure of a first embodiment of a laser diode driving circuit according to the present invention.

FIG. 2 shows the structure of a first embodiment of a laser diode driving circuit according to the present invention. In FIG. 2, the reference numeral 101 represents a laser diode, 102 an inverter for inverting the polarity of a laser diode light emission signal LDS, 103 a delay circuit constituted by a non-inverting element for delaying the laser diode light emission signal LDS, 104 a first NPN switching transistor which is connected to the laser diode 101 and the conduction of which is controlled in accordance with the inversion signal *LDS, 105 a second NPN switching transistor the conduction of which is differentially controlled with respect to the first switching transistor 104 in accordance with the delay signal LDD, 106 an impedance element connected to the second switching transistor 105 and provided with an impedance characteristic which is approximately equivalent to that of the laser diode 101, 107 a constant-current source for supplying a current to the laser diode 101 and the impedance element 106, and 108, 109 resistors. The laser diode 101 is disposed between the collector of the first switching transistor 104 and the constant-current source 107, and the impedance element 106 is disposed between the collector of the second switching transistor 105 and the constant-current source 107.

The non-inverting element as the delay circuit 103 is composed of a buffer amplifier or the like, and delays the laser diode light emission signal LDS by the time which is required for the inversion by the inverter 102.

When the controller (not shown) of an electrophotographic printer produces a laser diode light emission signal (hereinafter referred to as "LD light emission signal") LDS for subjecting the laser light to on/off modulation in accordance with printing information, the inverter 102 inverts the polarity of the LD light emission signal LDS and the delay circuit 103 delays the LD light emission signal LDS by a predetermined time. As a result, the time of fall and the time of rise of the inversion signal *LDS coincides with the time for fall and the time for rise of the delay signal LDD.

When the first switching transistor 104 is turned on in accordance with the inversion signal *LDS, the second switching transistor 105 is simultaneously turned off in accordance with the delay signal LDD. As a result, the aptitude to overshoot at the rise of the driving current Id is cancelled by the aptitude to undershoot of the impedance element 106, so that a driving current wave form having little overshoot is obtained. The laser diode 101 emits light by the driving current Id.

In this state, when the first switching transistor 104 is turned off in accordance with the inversion signal *LDS, the second switching transistor 105 is simultaneously turned on in accordance with the delay signal LDD. The current from the current source 107 thus flows to the impedance element 106, and the driving current Id becomes zero, so that the light of the laser diode 101 is extinct.

As described above, in the first embodiment, the delay circuit 103 constituted by the non-inverting element is provided so as to adjust the time for rise and the time for fall of the delay signal LDD to be equal to the time for fall and the time for rise of the inversion signal

*LDS and to turn on/off the first switching transistor 104 and the second switching transistor 105 in accordance with the inversion signal *LDS and the delay signal LDD. Consequently, it is possible to prevent overshoot of the driving current Id and, hence, overshoot of a light emission power, and to adjust the light emission time of the laser diode 101 substantially to the preset time.

There is sometimes a difference of several nanosecond (nsec) to several ten nsec in the delay time between the inverter 102 and the non-inverting element 103 due to a nonuniformity of elements or with other causes. In this case, it is impossible to adjust the time for rise and the time for fall of the delay signal LDD exactly to the time for fall and the time for rise of the inversion signal *LDS, so that the suppression of overshoot is insufficient. It is also impossible to adjust the light emission time of the laser diode 101 to the preset time.

Figure 3:
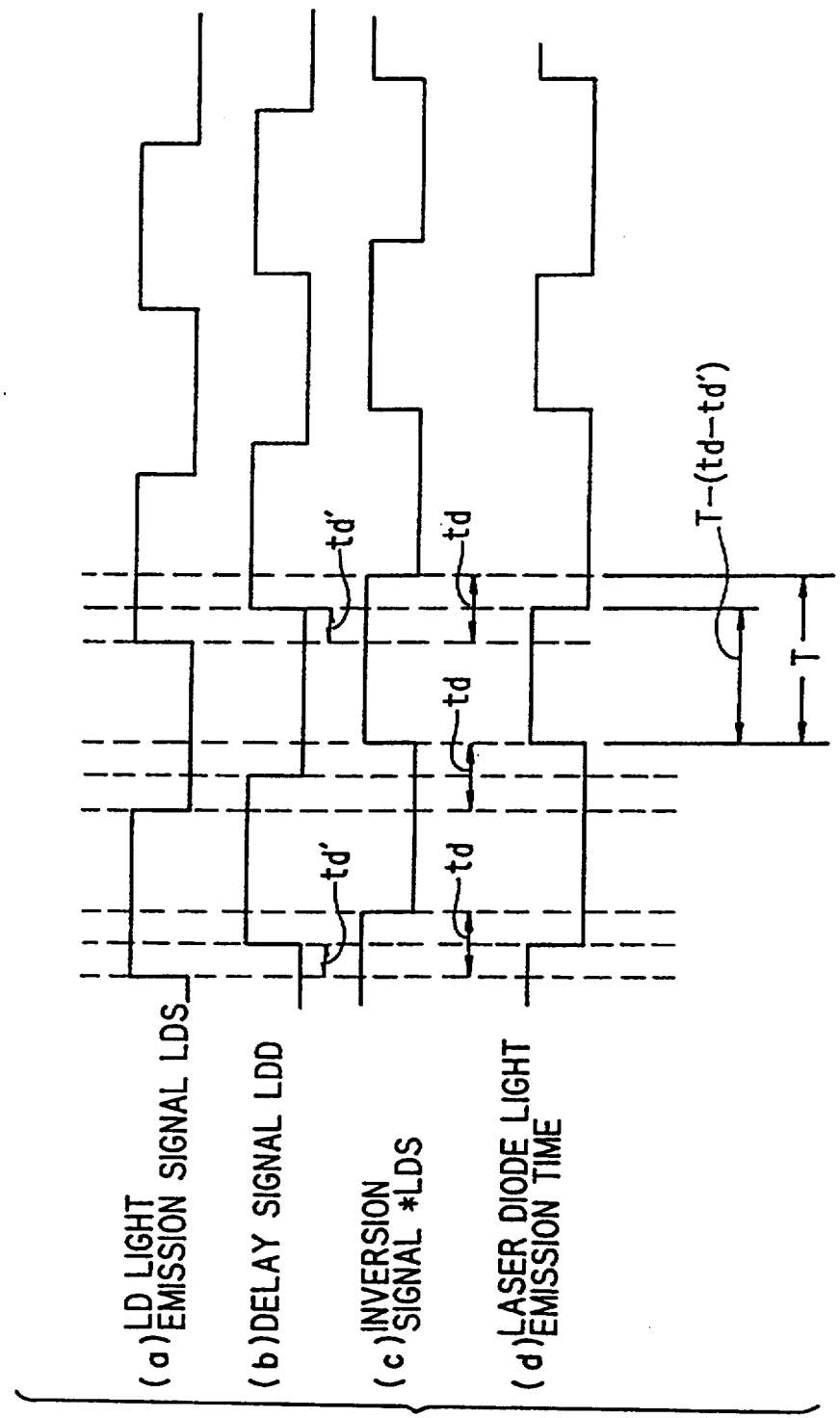
FIG. 3 shows the signal wave form of each part of the first embodiment shown in FIG. 2.

FIG. 3 shows the signal wave form of each part of the first embodiment which explains the light emission time. In FIG. 3, each wave form is slightly exaggerated so as to make the difference in the time for rise and the time for fall distinct.

The inverter (inverting element) 102 produces the inversion signal *LDS (c) the time td behind the laser diode light emission signal LDS (d), and the delay portion (non-inverting element) 103 produces the delay signal LDD (b) the time td' behind the laser diode light emission signal LDS (a) (<td). As a result, there is a time difference (td−td') between the time for rise and the time for fall of the inversion signal *LDS and the time for fall and the time for rise of the delay signal LDD.

Figure 9:
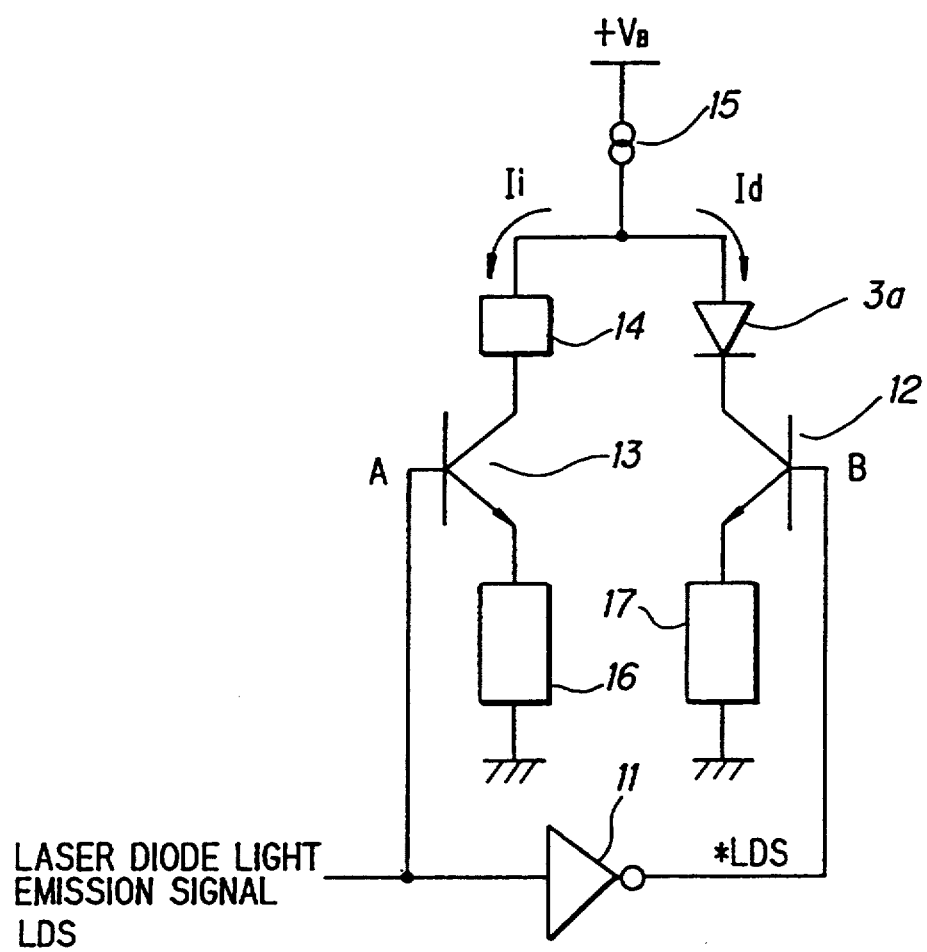
FIG. 9 shows the structure of a conventional laser diode driving circuit.
Figure 10:
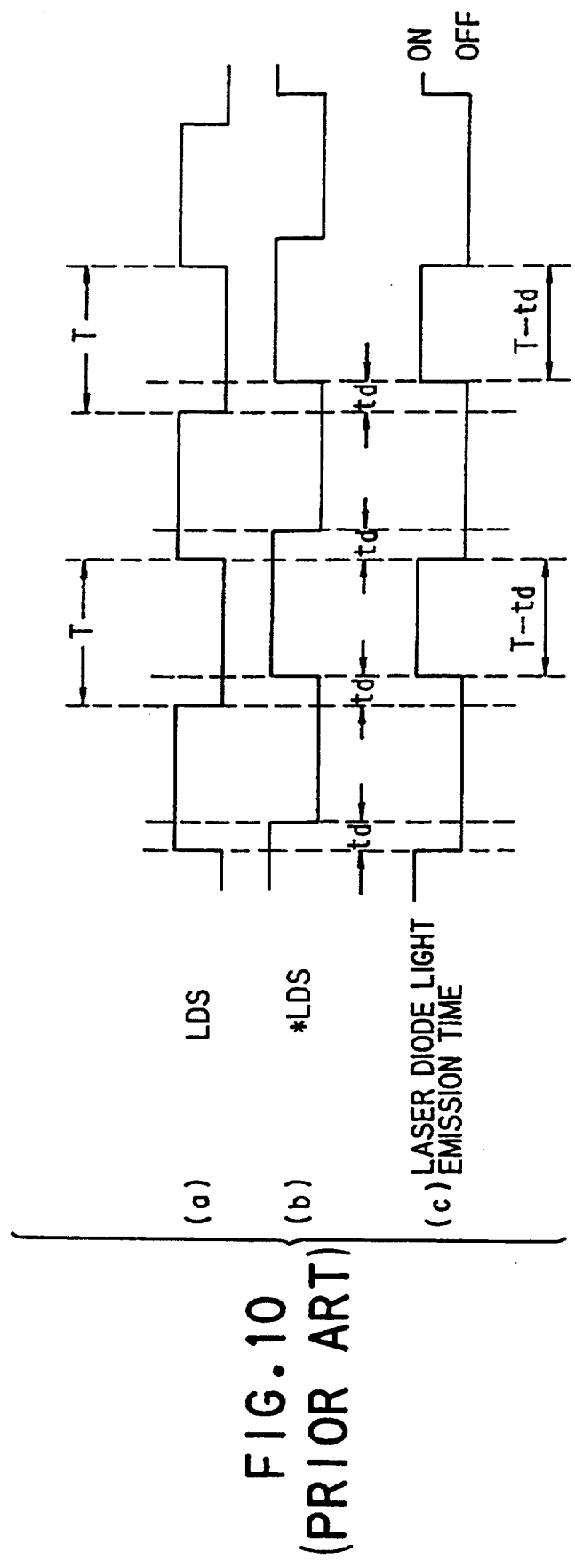
FIG. 10 is a wave form diagram of a conventional laser diode driving circuit which explains the operation thereof.

When only the first switching transistor 104 is conductive, the driving current Id which is necessary for light emission flows to the laser diode 101. Therefore, the laser diode 101 starts light emission at the rise of the inversion signal *LDS, and the light is extinct at the rise of the delay signal LDD. As a result, the light emission time is (T−(td−td'), which is shorter by (td−td') than the preset time T. As compared with the conventional laser diode driving circuit shown in FIG. 9, the delay time is shortened by td'.

(c) Second Embodiment

Figure 4:
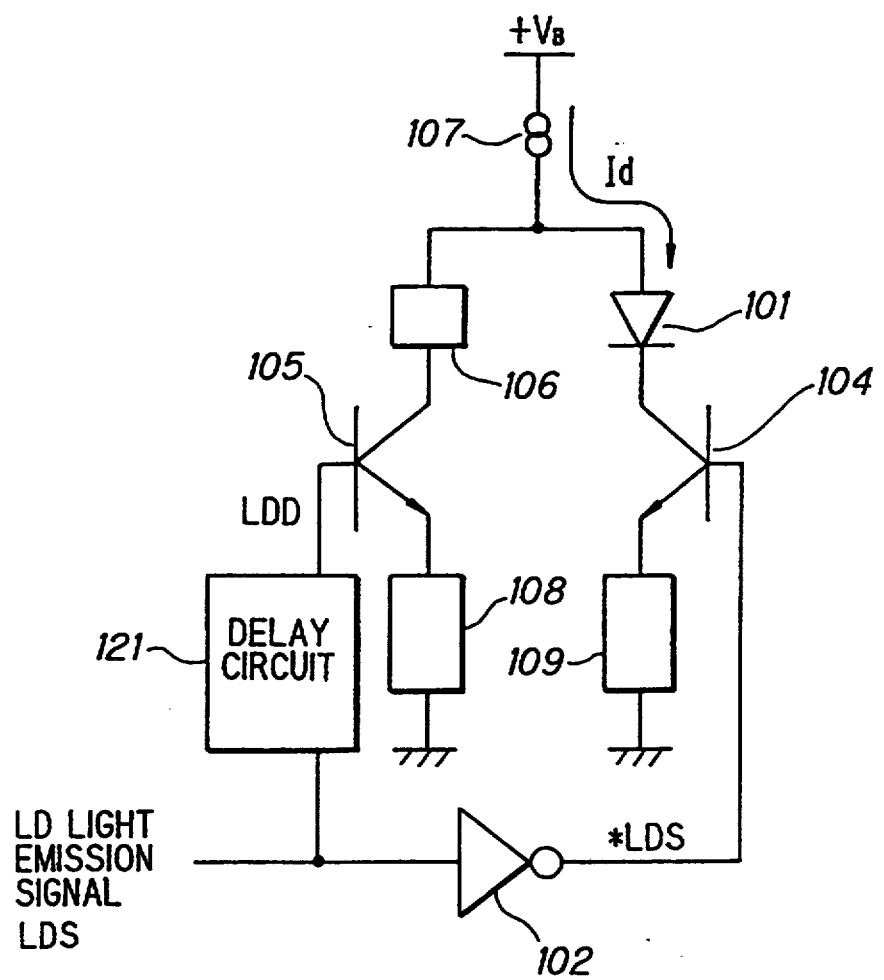
FIG. 4 shows the structure of a second embodiment of a laser diode driving circuit according to the present invention.

FIG. 4 shows the structure of a second embodiment of a laser diode driving circuit according to the present invention. The same reference numerals are provided for the elements which are the same as those of the first embodiment shown in FIG. 2. The second embodiment is different from the first embodiment in that a delay circuit 121 which can vary the delay time is provided in place of the delay circuit 103.

Figure 5A:
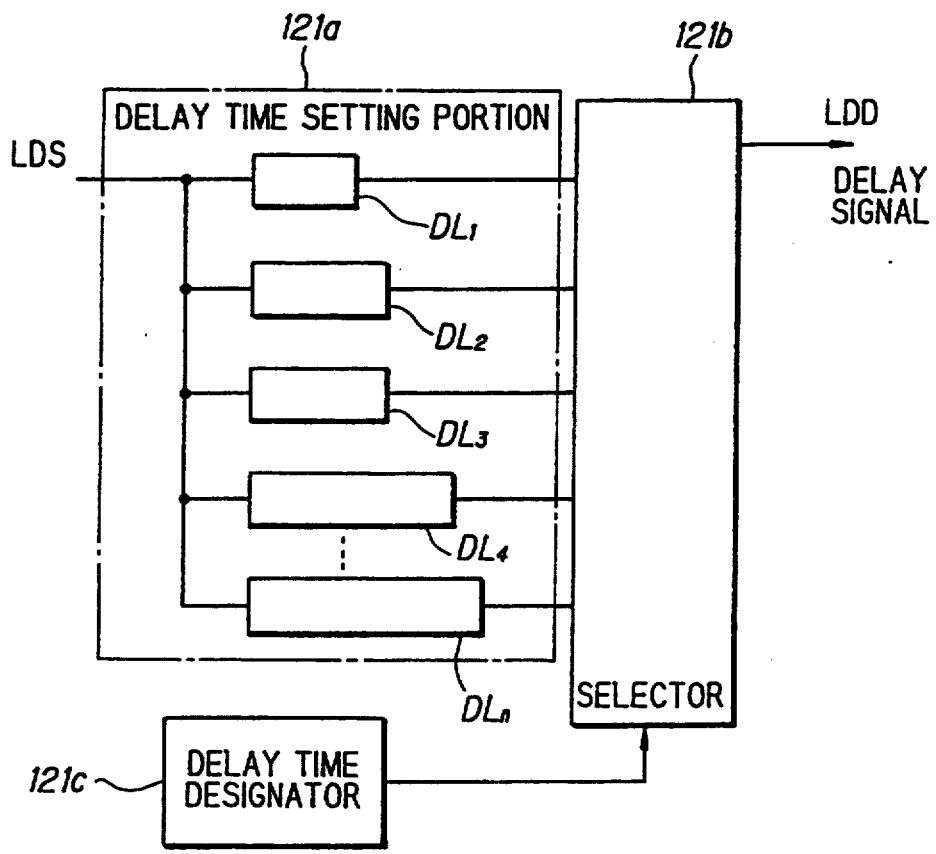
FIGS. 5A and 5B each show the structure of a delay circuit.
Figure 5B:
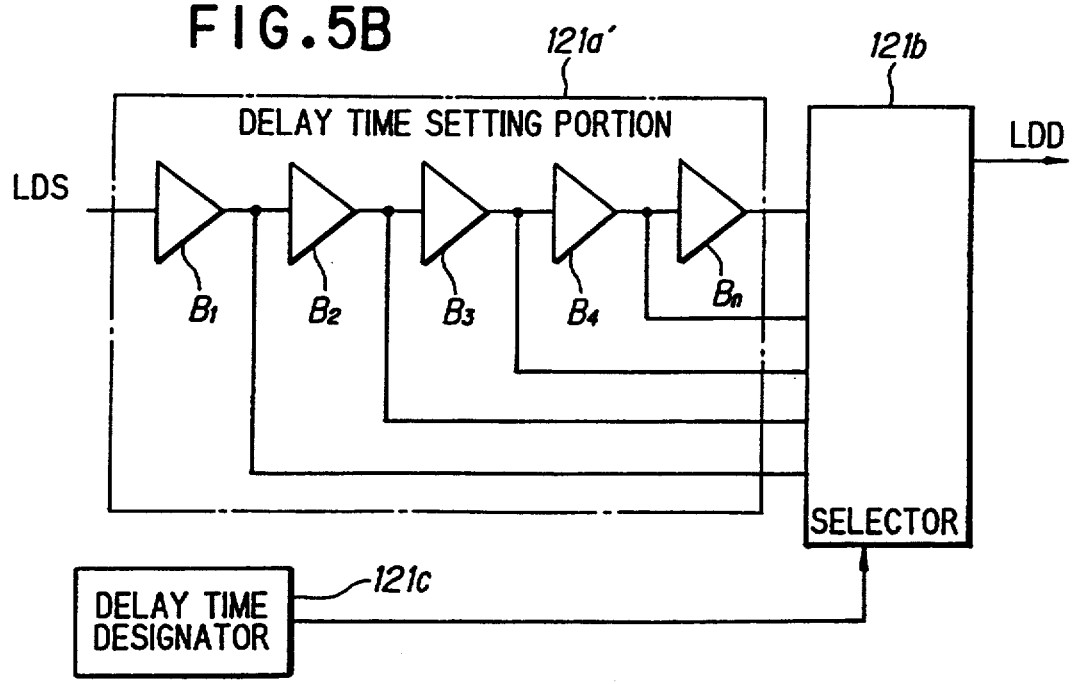

FIGS. 5A and 5B each show the structure of a delay circuit 121. In FIG. 5A, a plurality of delay lines (inductance elements) are used as delay elements, and in FIG. 5B, a plurality of non-inverting elements are used as delay elements.

In FIG. 5A, the reference numeral 121a represents a delay time setting portion for setting a plurality of delay times, 121b a selector, and 121c a delay time designator for instructing the selector 121b to select the output of the delay element whose delay time is equal to the inversion time td of the inverting element 102 and to output the selected output as the delay signal LDD.

The delay time setting portion 121a is composed of a plurality of delay elements DL1 to DLn (delay lines or inductance elements) which are connected in parallel so as to set different delay times. One terminal of each delay element is connected to the LD light emission signal inputting portion in common and the other terminal is connected to the selector 121b.

The inversion time td of the inverting element 102 is measured in advance. The delay time designator 121c determines the delay element DLi which sets the delay time td' equal to the inversion time td, and instructs the selector 121b to select the delay element DLi. The selector 121b outputs the output of the designated delay element DLi as the delay signal LDD. It is also possible to omit the selector 121b and the delay time designator 121c. In this case, only the output terminal of the delay element DLi that produces a predetermined delay time is connected to the delay signal outputting terminal. Alternatively, it is possible to connect the output terminal of each delay element to the delay signal outputting terminal and cut the connection of the delay elements other than the desired delay element.

In FIG. 5B, the reference numeral 121a' represents a delay time setting portion for setting a plurality of delay times, 121b a selector, and 121c a delay time designator for instructing the selector 121b to select the output of the delay element whose delay time is equal to the inversion time td of the inverting element 102 and to output the output of the designated delay element as the delay signal LDD.

The delay time setting portion 121a' is composed of a plurality of non-inverting elements B1 to Bn which are connected in series so as to set different delay times. The LD light emission signal LDS is input to the first non-inverting element B1 and the output portion of each non-inverting element is connected to the selector 121b.

The inversion time td of the inverting element 102 is measured in advance. The delay time designator 121c determines the non-inverting element Bi which sets the delay time td' equal to the inversion time td and instructs the selector 121b to select this non-inverting element Bi. The selector 121b outputs the output of the designated non-inverting element Bi as the delay signal LDD.

According to this structure, since it is possible to adjust the time for rise and the time for fall of the delay signal LDD exactly to the time for fall and the time for rise of the inversion signal *LDS, it is possible to prevent overshoot of the driving current Id and, hence, overshoot of a light emission power, and to adjust the light emission time of the laser diode 101 to the preset time.

(d) Third Embodiment

Figure 6:
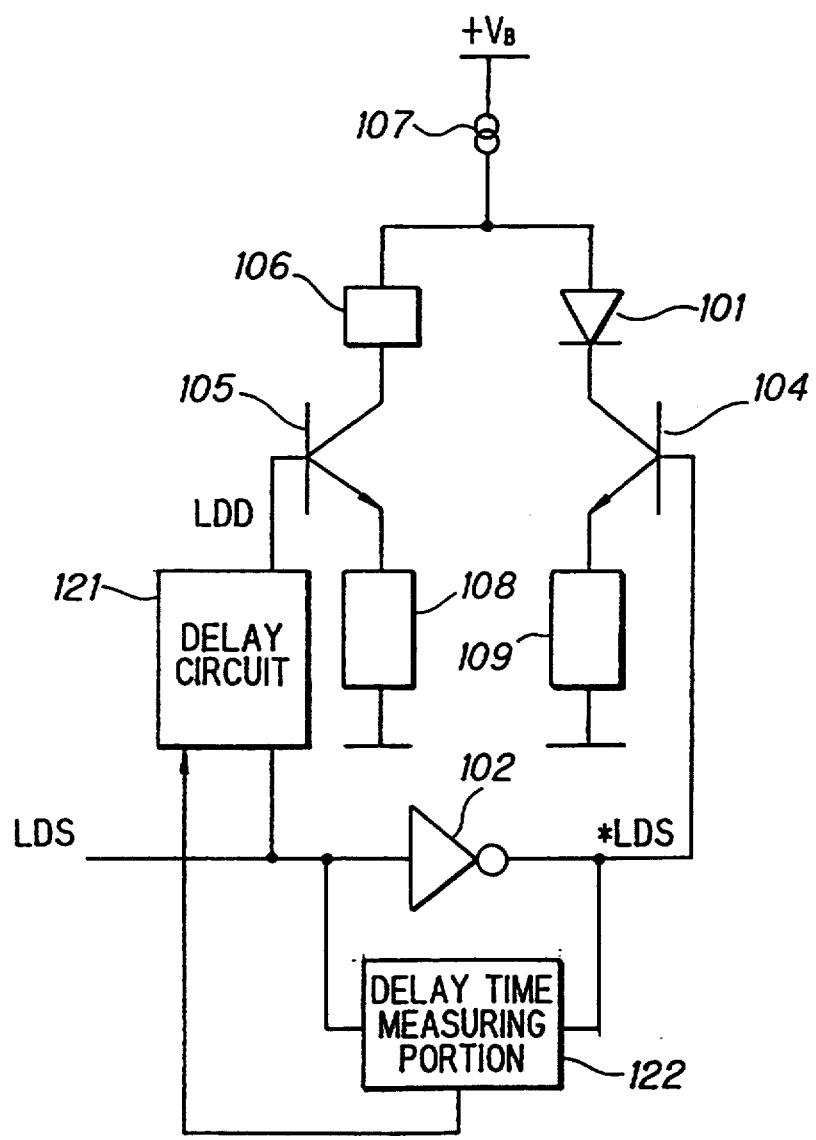
FIG. 6 shows the structure of a third embodiment of a laser diode driving circuit according to the present invention.

FIG. 6 shows the structure of a third embodiment of a laser diode driving circuit according to the present invention. The same reference numerals are provided for the elements which are the same as those of the second embodiment shown in FIG. 4.

In FIG. 6, the reference numeral 121 represents a delay circuit having the structure shown in FIG. 5A or 5B, and 122 a delay time measuring portion for measuring the delay time (inversion time) td required for the inversion by the inverting element 102.

The delay time measuring portion 122 measures the inversion time (inversion delay time) td of the inverting element 102, and inputs the measured delay time td to the delay time designator 121c of the delay circuit 121. The delay time designator 121c determines the output of the delay element which corresponds to the inversion delay time td, and inputs a selection signal to the selector 121b so as to instruct the selector 121b to select the output of the designated delay element. The selector 121b selects the output of the predetermined delay element in accordance with the selection signal and output the output of the selected delay element as the delay signal LDD.

According to this structure, it is possible to automatically adjust the delay time td' of the delay circuit 121 to the inversion time td and respond to a change in the inversion time due to the nonuniformity of elements or a change of an element with time.

Although an NPN switching transistor is used as a switching element in the first to third embodiments, a PNP transistor, an FET or other switching elements are also usable instead.

In these embodiments, the driving current Id is supplied to the laser diode 101 when the LD light emission signal LDS is at a low level. Alternatively, the driving current Id may be supplied to the laser diode 101 when the LD light emission signal LDS is at a high level. In this case, the positions of the laser diode 101 and the impedance element 106 are changed with each other in the first to third embodiments.

(e) Electrophotographic Printer to which the Present Invention is Applied

Figure 7:
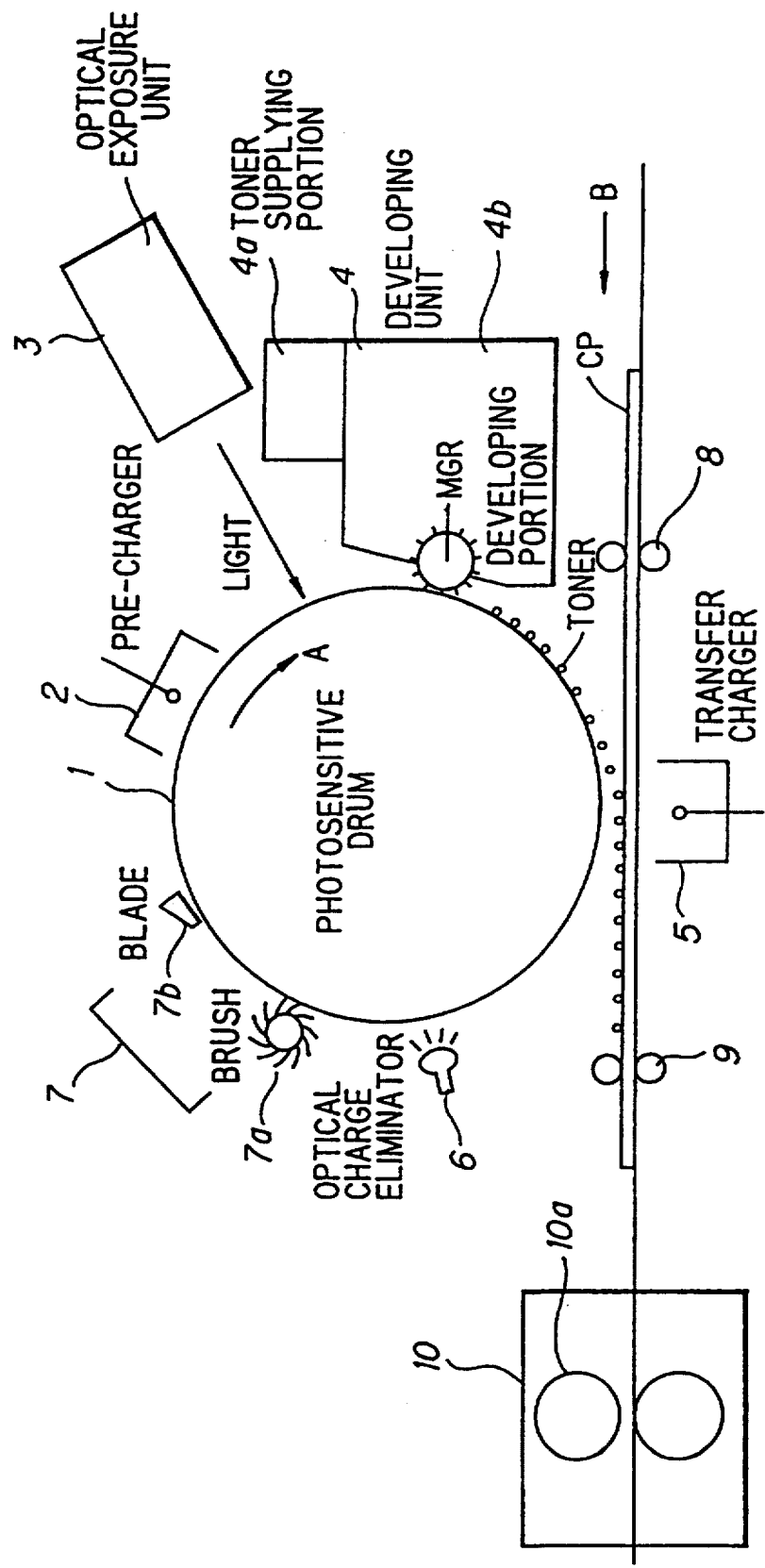
FIG. 7 shows the entire structure of an electrophotographic printer.

FIG. 7 shows the entire structure of an electrophotographic printer for forming an electrostatic latent dot image on the surface of a photosensitive drum by subjecting the laser light as an exposure source to on/off modulation in accordance with printing information. In FIG. 7, the reference numeral 1 represents a photosensitive drum having a photoconductor (photosensitive material) on the surface thereof and rotating in the direction indicated by the arrow A at a constant rate, 2 a pre-charger for uniformly charging the surface of the photosensitive drum 1, 3 an optical exposure unit for projecting an optical image on the photosensitive drum 1 so as to form an electrostatic latent image, and 4 a developing unit for forming a toner image which corresponds to the electrostatic latent image. The developing unit 4 is provided with a toner supplying portion 4a and a developing portion 4b. The reference numeral 5 represents a transfer charger for transferring the toner image onto paper CP, 6 an optical charge eliminator for eliminating the charges on the photosensitive drum 1 by projecting light, and 7 a cleaner provided with a brush 7a and a blade 7b for removing and clearing the toner remaining on the photosensitive drum 1. The reference numerals 8, 9 represent rollers for conveying paper, and 10 a fixing portion for fixing the toner image transferred onto the paper. The fixing portion 10 is composed of, for example, heat fixing rollers 10a or the like. Sheets of the paper CP are supplied one by one from a hopper (not shown) disposed on the right side. Each sheet of paper is then conveyed in the direction indicated by the arrow B, passed through the transfer charger 5 and the fixing portion 10, and discharged to a stacker (not shown) disposed on the left side of the fixing portion 10.

When an optical image is projected onto the surface of the photosensitive drum 1 which is uniformly, for example, positively charged by the pre-charger 2, the charges at the portion to which light is projected are released and an electrostatic image is formed. Thereafter, when the developing unit 4 spreads the positively charged toner over the surface of the photosensitive drum 1 by rotating a magnet roll (developing roll) MGR which is biased by a predetermined developing voltage, the toner moves onto the latent image so as to form a toner image. The transfer charger 5 then transfers the toner image onto the paper CP by the corona discharge from the back surface of the paper CP at a potential of the opposite polarity (negative) to the polarity of the charges of the toner image. The paper CP with the toner image transferred thereon by the transfer charger 5 is conveyed to the fixing portion 10, which fixes the toner image with heat and discharges the paper to the stacker (not shown).

After the toner image is transferred, the photosensitive drum 1 further rotates so that the charges are eliminated by the optical charge eliminator 6 and the remaining toner is removed by the cleaner 7. Thus, the photosensitive drum 1 is ready for the next formation of an electrostatic latent image.

Figure 8:
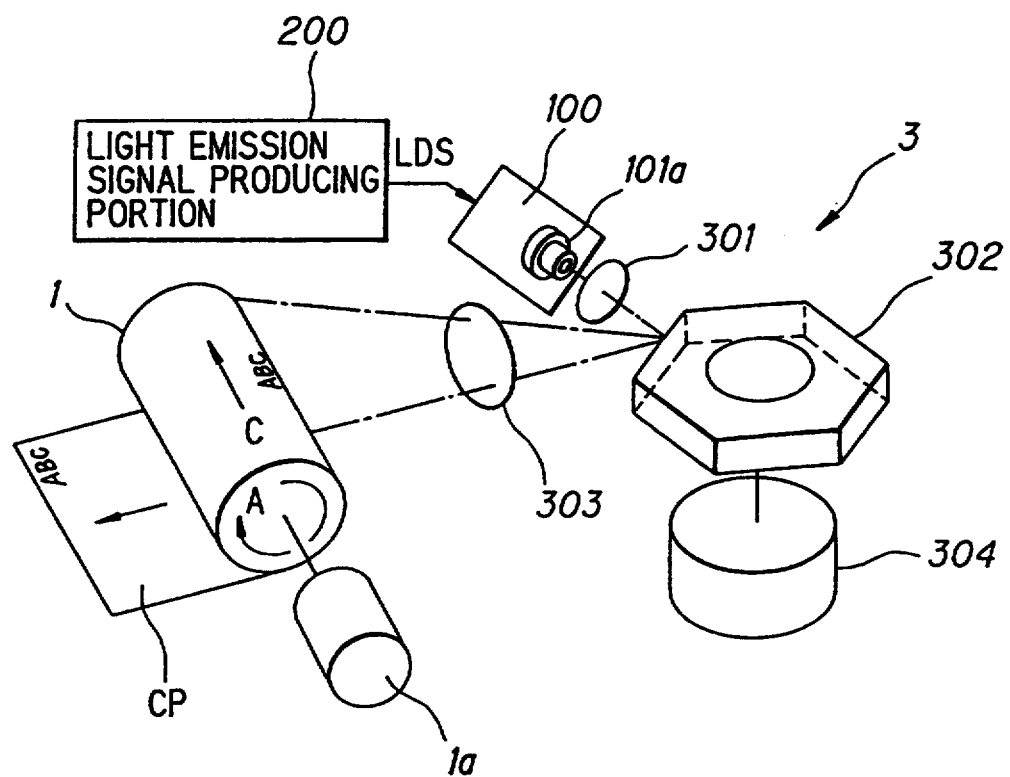
FIG. 8 shows an optical exposure unit to which the present invention is applied.

FIG. 8 shows the structure of the optical exposure unit 3. The reference numeral 100 represents a laser diode driving circuit, 101a a laser diode, and 200 a light emission signal producing portion for outputting a LD light emission signal LDS. The light emission signal producing portion 200 develops the printing information (character code or the like) for each page into a dot image and produces the LD light emission signal LDS which subjects the laser light to on/off modulation on the basis of the dot image data. The reference numeral 301 represents a collimate lens, 302 a polygonal mirror for scanning the photosensitive drum 1 in the longitudinal direction (indicated by the arrow C) with the laser light, 303 an F-$\theta$ lens (image formation lens), and 304 a spindle motor for rotating the polygonal mirror 302 at a constant rate.

The light emission signal producing portion 200 outputs the LD light emission signal LDS on the basis of the dot image data in synchronism with the laser scanning. The laser diode driving circuit 100 subjects the laser light to on/off modulation by turning the laser diode 101a on/off in accordance with the LD light emission signal LDS.

The laser light subjected to on/off modulation reaches the polygonal mirror 302 through the collimate lens 301. Since the polygonal mirror 302 is rotated at a constant rate by the spindle motor 304, the incident laser light is repeatedly moved in the longitudinal direction of the photosensitive drum 1 through the F-$\theta$ lens 303. If the photosensitive drum 1 is scanned in the longitudinal direction with the laser light which is subjected to on/off modulation on the basis of the dot image data while being rotated in the direction indicated by the arrow A, the optical dot image is projected onto the surface of the photosensitive drum 1 and, hence, the electrostatic latent dot image is formed on the surface of the photosensitive drum 1.

In this way, when the laser light of an electrophotographic printer is subjected to on/off modulation by the laser diode driving circuit of the present invention, high-quality printing at 600 dpi (dot/inch) is enabled.

As explained above, according to the present invention, a delay circuit is provided so as to adjust the time for rise and the time for fall of the delay signal to the time for fall and the time for rise of the inversion signal, and differentially turn on/off the first switching element and the second switching element in accordance with the inversion signal and the delay signal. Consequently, it is possible to prevent overshoot of the driving current and, hence, overshoot of a light emission power, and to adjust the light emission time of the laser diode to the preset time.

In addition, according to the present invention, the delay circuit is composed of a plurality of delay elements for setting different delay times, and a selector for selecting the output of the delay element whose delay time is equal to the inversion time, it is possible to exactly adjust the delay time to the inversion times to safely prevent overshoot of a light emission powers and to exactly adjust the light emission time of the laser diode to the preset time.

Furthermore, according to the present invention, since an inversion time measuring portion for measuring the inversion time of an inverting element is provided so as to output the output of a predetermined delay element determined on the basis of the inversion time as a delay signal, it is possible to automatically adjust the delay time of the delay circuit to be equal to the inversion time, thereby responding to a change in the inversion time due to the nonuniformity of elements or a change of an element with time.

If the laser light of an electrophotographic printer is subjected to on/off modulation by the laser diode driving circuit of the present invention, high-quality printing at 600 dpi (dot/inch) is enabled.

As many apparently widely different embodiments of the present invention can be made without departing from the spirit and scope thereof, it is to be understood that the invention is not limited to the specific embodiments thereof except as defined in the appended claims.

What is claimed is:

1. A laser diode driving circuit comprising:
   an inverter for inverting the polarity of a laser diode driving signal and outputting an inversion signal;
   a delay circuit for delaying said laser diode driving signal and outputting a delay signal;
   a first switching element which is connected to a laser diode and the conduction of which is controlled in accordance with one of the inversion signal and the delay signal;
   a second switching element, the conduction of which is differentially controlled with respect to said first switching element in accordance with the other signal than said one of the inversion signal and the delay signal;
   an impedance element which is connected to said second switching element; and
   a current source for supplying a current to said laser diode and said impedance element.

2. A laser diode driving circuit according to claim 1, wherein:
   said inverter has an inversion time; and
   said delay circuit includes:
   a plurality of delay elements for setting different delay times and providing outputs, each delay element providing a respective output; and
   a selector for selecting the respective output of one delay element of said plurality of delay elements which is equal to the inversion time of said inverter and outputting the selected respective output as said delay signal.

3. A laser diode driving circuit according to claim 2, wherein each of said plurality of delay elements is a delay line.

4. A laser diode driving circuit according to claim 2, wherein said plurality of delay elements are non-inverting elements connected in series so as to input a delay signal of each of said non-inverting elements to said selector.

5. A laser diode driving circuit according to claim 1, wherein:
   said inverter has an inversion time;
   said delay circuit includes:
   a plurality of delay elements for setting different delay times and providing outputs, each delay element providing a respective output and each delay element having a respective delay time;
   a selector for selecting the respective output of one delay element of said plurality of delay elements whose respective delay time is equal to the inversion time of said inverter and outputting the selected respective output as said delay signal; and
   an inversion time measuring portion for measuring the inversion time of said inverter, and
   said selector outputs the respective output of a predetermined delay element as said delay signal on the basis of said inversion time.

* * * * *